(12) United States Patent
Malone

(10) Patent No.: US 6,951,769 B2
(45) Date of Patent: Oct. 4, 2005

(54) METHOD FOR STRIPPING SACRIFICIAL LAYER IN MEMS ASSEMBLY

(75) Inventor: Joshua Malone, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/454,198

(22) Filed: Jun. 4, 2003

(65) Prior Publication Data

US 2004/0248417 A1 Dec. 9, 2004

(51) Int. Cl.⁷ .............................................. H01L 21/00
(52) U.S. Cl. ........................... 438/51; 438/64; 438/106; 257/682; 257/684
(58) Field of Search ........................... 438/51, 64, 106; 257/682, 684

(56) References Cited

U.S. PATENT DOCUMENTS

| | | |
|---|---|---|
| 4,441,791 A | 4/1984 | Hornbeck |
| 4,566,935 A | 1/1986 | Hornbeck |
| 4,662,746 A | 5/1987 | Hornbeck |
| 4,956,619 A | 9/1990 | Hornbeck |
| 5,312,882 A | 5/1994 | De Simone et al. |
| 5,382,623 A | 1/1995 | De Simone et al. |
| 5,451,633 A | 9/1995 | De Simone et al. |
| 5,496,901 A | 3/1996 | De Simone |
| 5,505,807 A | 4/1996 | Min et al. |
| 5,506,317 A | 4/1996 | De Simone et al. |
| 5,514,759 A | 5/1996 | De Simone et al. |
| 5,527,865 A | 6/1996 | De Simone et al. |
| 5,530,077 A | 6/1996 | De Simone et al. |
| 5,561,216 A | 10/1996 | De Simone et al. |
| 5,583,688 A | 12/1996 | Hornbeck et al. |
| 5,589,105 A | 12/1996 | De Simone et al. |
| 5,618,894 A | 4/1997 | De Simone et al. |
| 5,639,836 A | 6/1997 | De Simone et al. |
| 5,672,667 A | 9/1997 | De Simone et al. |
| 5,674,957 A | 10/1997 | De Simone et al. |
| 5,679,737 A | 10/1997 | De Simone et al. |
| 5,688,879 A | 11/1997 | De Simone |
| 5,739,223 A | 4/1998 | De Simone |
| 5,766,367 A | 6/1998 | Smith et al. |
| 5,780,553 A | 7/1998 | De Simone et al. |

(Continued)

OTHER PUBLICATIONS

U.S. Appl. No. 10/034,647, entitled "Method of Undercutting Micro–Mechanical Device With Super–Critical Carbon Dioxide" filed Dec. 8, 2001.

Supercritical Carbon–dioxide Cleaning Technology Review, http://www.pprc.org/pprc/p2tech/co2/co2intro.html (Jul. 1996).

(Continued)

Primary Examiner—David Nelms
Assistant Examiner—Renee R. Berry
(74) Attorney, Agent, or Firm—Charles A. Brill; Wade James Brady, III; Frederick J. Telecky, Jr.

(57) ABSTRACT

The present invention provides methods of manufacturing a MEMS assembly. In one embodiment, the method includes mounting a MEMS device, such as a MEMS mirror array, on an assembly substrate, where the MEMS device has a sacrificial layer over components formed therein. The method also includes coupling an assembly lid to the assembly substrate and over the MEMS device to create an interior of the MEMS assembly housing the MEMS device, whereby the coupling maintains an opening to the interior of the MEMS assembly. Furthermore, the method includes removing the sacrificial layer through the opening. A MEMS assembly constructed according to a process of the present invention is also disclosed.

10 Claims, 2 Drawing Sheets

U.S. PATENT DOCUMENTS

| | | |
|---|---|---|
| 5,783,082 A | 7/1998 | De Simone et al. |
| 5,824,726 A | 10/1998 | De Simone et al. |
| 5,840,820 A | 11/1998 | De Simone et al. |
| 5,855,819 A | 1/1999 | De Simone et al. |
| 5,860,467 A | 1/1999 | De Simone et al. |
| 5,863,612 A | 1/1999 | De Simone |
| 5,866,005 A | 2/1999 | De Simone et al. |
| 5,872,157 A | 2/1999 | De Simone et al. |
| 5,922,833 A | 7/1999 | De Simone |
| 5,939,501 A | 8/1999 | De Simone et al. |
| 5,939,502 A | 8/1999 | De Simone et al. |
| 5,939,785 A | 8/1999 | Klonis et al. |
| 5,944,996 A | 8/1999 | De Simone et al. |
| 5,945,477 A | 8/1999 | De Simone et al. |
| 5,977,292 A | 11/1999 | De Simone et al. |
| 5,981,673 A | 11/1999 | De Simone et al. |
| 6,001,418 A | 12/1999 | De Simone et al. |
| 6,010,542 A | 1/2000 | De Young et al. |
| 6,024,801 A | 2/2000 | Wallace et al. |
| 6,025,459 A | 2/2000 | Di Simone et al. |
| 6,083,565 A | 7/2000 | Carbonell et al. |
| 6,107,443 A | 8/2000 | De Simone et al. |
| 6,127,000 A | 10/2000 | Carbonell et al. |
| 6,147,790 A | 11/2000 | Meir et al. |
| 6,176,895 B1 | 1/2001 | De Simone et al. |
| 6,211,422 B1 | 4/2001 | De Simone et al. |
| 6,224,774 B1 | 5/2001 | De Simone et al. |
| 6,240,936 B1 | 6/2001 | De Simone et al. |
| 6,242,165 B1 | 6/2001 | Vaarstra |
| 6,248,136 B1 | 6/2001 | McClain et al. |
| 6,277,753 B1 | 8/2001 | Mullee et al. |
| 6,288,202 B1 | 9/2001 | De Simone et al. |
| 6,298,902 B1 | 10/2001 | De Simone et al. |
| 6,306,564 B1 | 10/2001 | Mullee |
| 6,323,982 B1 | 11/2001 | Hornbeck |
| 6,404,942 B1 * | 6/2002 | Edwards et al. ............... 385/18 |
| 6,654,155 B2 * | 11/2003 | Rosa et al. ................. 359/290 |
| 6,806,993 B1 * | 10/2004 | Adams et al. ............... 359/291 |

OTHER PUBLICATIONS

Technical Issue and CO2–based Cleaning Systems, http://www.pprc.org/pprc/p2tech/co2/co2tech.html (Jul. 1996).

McClain et al, Design of Nonionic Surfactants for Supercritical Carbon Dioxide, Science, vol. 274 (Dec. 1996).

Biberger et al, Photoresist and Photoresist Resiue Removal with Supercritical Co2—A Novel Approach to Cleaning Wafers, Semiconductor Fabtech, 12th Edition (Jul. 2000).

Jafri et al., Critical Point Drying and Cleaning for MEMS Technology, Part of the SPIE Conference on MEMS Reliability for Critical and Space Applications, SPIE vol. 3880 (Sep. 1999).

* cited by examiner

METHOD FOR STRIPPING SACRIFICIAL LAYER IN MEMS ASSEMBLY

TECHNICAL FIELD OF THE INVENTION

Disclosed embodiments herein relate generally to micro electro-mechanical systems (MEMS) assemblies, and, more specifically, to methods for stripping a sacrificial layer from MEMS devices during the manufacturing process.

BACKGROUND OF THE INVENTION

Optoelectronic devices have continued to gain popularity with today's top manufacturers. Specifically, micro electro-mechanical devices, such as actuators, motors, sensors, and micro electro-mechanical systems (MEMS), such as spatial light modulators (SLMs), are some of the few types of optoelectronic devices gaining in use. Such packaged SLMs and other types of MEMS devices are employable in "digital micro-mirror device" (DMD) technology, of the type designed and used by Texas Instruments of Dallas, Tex.

Such DMD MEMS assemblies include arrays of electronically addressable mirror elements (or "pixels"), which are selectively movable or deformable. Each mirror element is movable in response to an electrical input to an integrated addressing circuit formed monolithically with the addressable mirror elements in a common substrate. Such MEMS assemblies modulate incident light in a spatial pattern, pursuant to an electrical or other input, in phase, intensity, polarization or direction. The incident light is modulated by reflection from each mirror element.

Unfortunately, defects may be caused by contamination of the MEMS mirror array during various stages of the manufacturing process. For example, at certain points, the MEMS array may be stripped of any protective layer, exposing the MEMS array to contaminates before it is sealed within the MEMS assembly. More particularly, contaminants, often in the form of debris particles, may contaminate the mirror array during the wafer saw process, array mounting stage, wire-bonding processes, and even the during the final assembly stage for the MEMS assembly. Such contamination may detrimentally affect the function of the mirror, and as the number of defects increases, so too does the overall manufacturing costs due to decreased wafer yield.

BRIEF SUMMARY OF THE INVENTION

Embodiments described in this application provide methods of manufacturing a MEMS assembly that protects the MEMS devices from contamination. In one embodiment, the method includes mounting a MEMS device, such as a MEMS mirror array, on an assembly substrate, where the MEMS device has a sacrificial layer over and/or under components formed therein. The method also includes coupling an assembly lid to the assembly substrate and over the MEMS device to create an interior of the MEMS assembly housing the MEMS device, whereby the coupling maintains an opening to the interior of the MEMS assembly. The method further includes removing the sacrificial layer through the opening.

In another aspect, described methods provide for a MEMS assembly constructed by mounting a MEMS device on an assembly substrate, where the MEMS device has a sacrificial layer over components formed on it. The exemplary process includes the coupling of an assembly lid to the assembly substrate and over the MEMS device to create an interior of the MEMS assembly that houses the MEMS device, whereby the coupling maintains an opening to the interior of the MEMS assembly. In this embodiment, the MEMS assembly is further constructed by removing the sacrificial layer through the opening.

BRIEF DESCRIPTION OF THE DRAWINGS

For a more complete understanding of the present invention, reference is now made to the following detailed description taken in conjunction with the accompanying drawings. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION OF THE INVENTION

Figure 1:
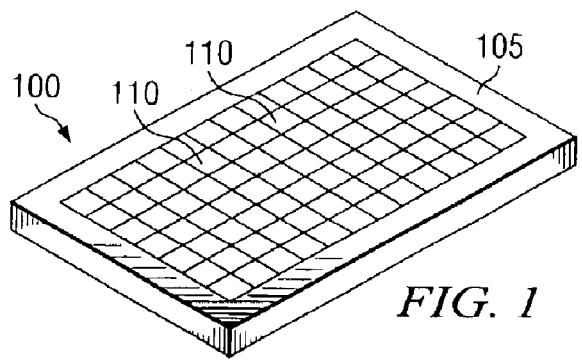
FIG. 1 illustrates an isometric view of one embodiment of a MEMS array that could be incorporated in MEMS assemblies of the present invention.

Referring initially to FIG. 1, illustrated is an isometric view of one embodiment of a micro electro-mechanical system (MEMS) mirror array 100. The illustrated MEMS mirror array 100 includes a semiconductor substrate 105 on which a plurality of MEMS mirrors 110, as well as other associated components, are formed. The MEMS array 100 may have, for example, several hundred, thousand, or even hundreds of thousands, of mirrors 110 formed thereon. Examples of MEMS structures and manufacturing methods have been developed and described by Texas Instruments of Dallas, Tex., including "digital micro-mirror device" (DMD) technology.

In function, the mirrors 110 formed on the MEMS array 100 reflect beams of light, therefore modulating the light, by moving or rotating on one or more relatively thin, integral supporting beams or hinges. Depending on the type of beams or hinges formed, the mirrors 110 may be a cantilever design or may be supported by one or more torsion beams or flexure beams, depending on the desired application. Deflection of each mirror 110 is effected by the attractive electrostatic force exerted on a portion of the mirrors 110 by an electrical field resulting from a potential applied to an associated control electrode located beneath each of the mirrors 110 and formed on the substrate 105. The potential is selectively applied to the control electrode by an addressing circuit formed in the semiconductor substrate 105 beneath the mirrors 110.

When a mirror 110 is deflected to a first position according to a voltage applied to the control electrodes by the addressing circuit, the mirror 110 reflects light along a first path to a first site. However, when the addressing circuit applies a different voltage to the underlying electrodes, the mirror 110 is electrostatically attracted to a second position whereby it reflects light along a second path, different from the first path, thus redirecting the light to a different site. From the foregoing, the incident light is modulated by the mirrors 110 in the MEMS array 100 so that it selectively reaches the first or second site, whichever contains the desired target of the beam of light.

Figure 2A:
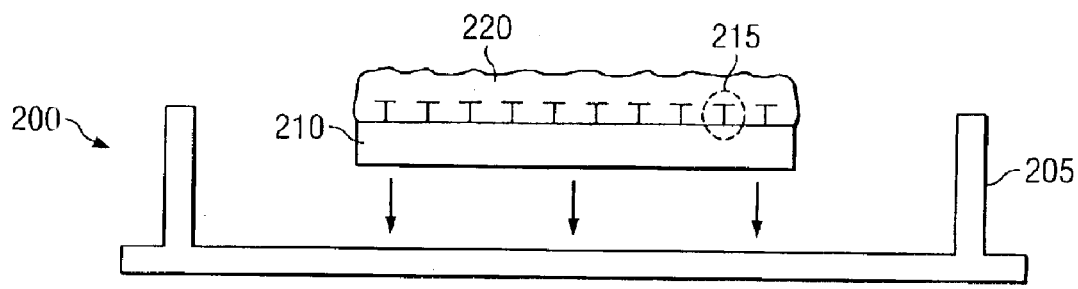
FIG. 2A illustrates a side section view of the MEMS assembly during an initial stage of the manufacturing process of the present invention.

Turning now to FIGS. 2A–2D, illustrated are side section views of a MEMS assembly 200 throughout various stages of a manufacturing process according to the principles disclosed herein. More specifically, beginning with FIG. 2A, illustrated is the MEMS assembly 200 during an initial stage of one embodiment of a manufacturing process. The MEMS assembly 200 includes an assembly substrate 205 on which a MEMS device, in this example a MEMS mirror array 210, is shown being mounted. As discussed above, the MEMS array 210 includes a plurality of mirrors 215 for modulating an incoming beam or beams of light in the manner described above.

Also as shown in FIG. 2A, the MEMS array 210 includes a sacrificial protective layer 220 formed thereon. Among other things, the protective layer 220 provides protection for the mirrors 215 from contaminants that otherwise reach the MEMS array 210. If contaminants are allowed to reach and affect the MEMS array 210, the yield of good devices from the wafer from which the MEMS array 210 was cut potentially decreases. The protective layer 220 may be blanket-deposited over the MEMS array 210 while it is still joined with other arrays to form the semiconductor wafer. In one embodiment, the protective layer 220 is a photoresist, but other types of protective layers 220 may also be employed.

Figure 2B:
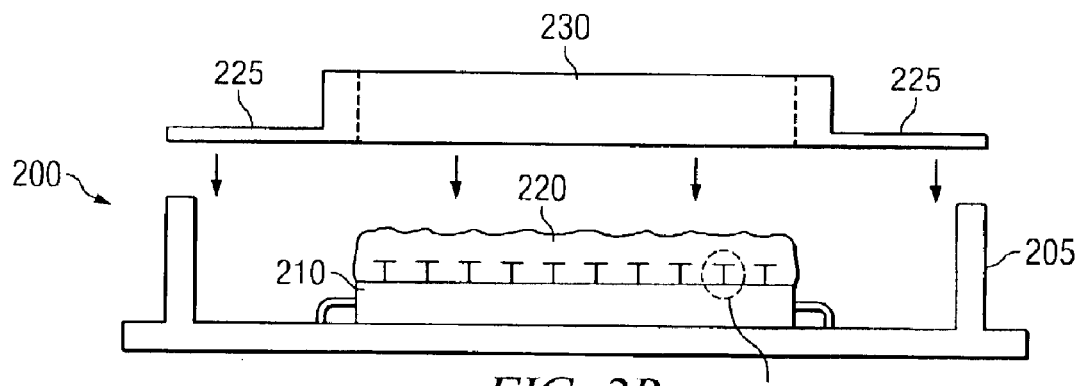
FIG. 2B illustrates the MEMS assembly of FIG. 2A during another stage in the manufacturing process.

Looking now at FIG. 2B, illustrated is the MEMS assembly 200 of FIG. 2A during another stage in the manufacturing process. Specifically, an assembly lid 225, having a window 230 for incident light to pass through and reach the MEMS array 210, is shown being mounted onto the assembly substrate 205 and over the MEMS array 210. The mounting of the lid 225 creates an interior of the MEMS assembly 200, in which the MEMS array 210 is now located. However, removing the protective layer 220 from the MEMS array 210 before the assembly lid 225 is coupled to the substrate 205 would leave the MEMS array 210 exposed to potential contaminants. As a result, the process of the present invention provides for the coupling of the assembly lid 225 to the substrate 205 prior to the removal of the protective layer 220.

Figure 2C:
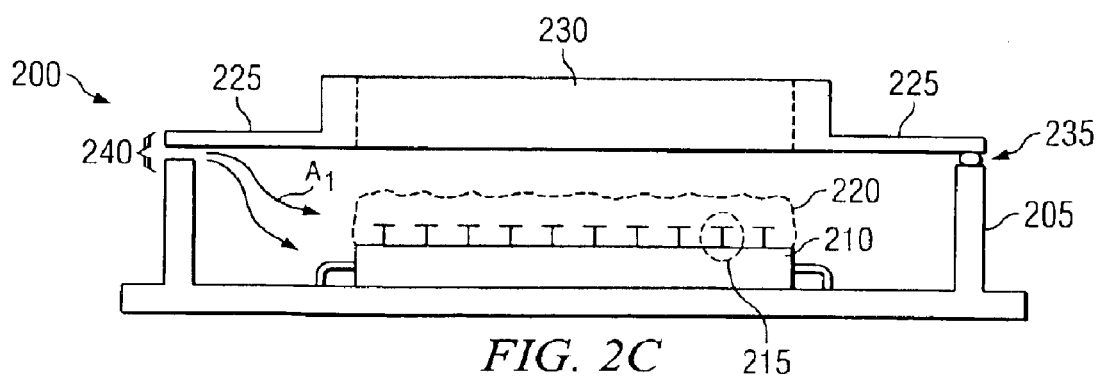
FIG. 2C illustrates the MEMS assembly later in the manufacturing process.

Referring now to FIG. 2C, illustrated is the MEMS assembly 200 later in the manufacturing process. As illustrated, the assembly lid 225 has been coupled or affixed to the assembly substrate 205. Specifically, in this embodiment, the assembly lid 225 has been tack-welded to the substrate 205, as shown by the tack-weld bead 235 on the right side of the MEMS assembly 200. Since the assembly lid 225 has only been tack-welded to the assembly substrate 205, openings or vents 240 remain along different portions of the MEMS assembly 200, where the lid 225 and the substrate 205 meet but are not welded. Other techniques for leaving such openings 240 include applying a non-continuous bead of adhesive between the substrate 205 and the lid 225. Although only one opening 240 is illustrated in FIGS. 2A–2D, several openings 240 between the assembly lid 225 and the assembly substrate 205 may be prevalent, for example, via the spaces between multiple tack welds, until the two are permanently sealed together towards the end of the manufacturing process.

Once the MEMS assembly 200 is tack-welded, or otherwise partially coupled together, the entire assembly may be moved to a different station that has pressurizing capabilities. Alternatively, the MEMS assembly 200 may be entirely or substantially manufactured in such a location. In yet another embodiment, when pressurizing is not required or desired, the MEMS assembly 200 may be manufactured at any appropriate station, perhaps already present in conventional manufacturing processes.

Still referring to FIG. 2C, a removing material, for example, a gas or fluid, is then introduced into the interior of the MEMS assembly 200, and used to remove or strip the protective layer 220 covering the MEMS array 210. The insertion of the removal fluid or other removing material is indicated by arrows $A_1$. In one embodiment, a supercritical "fluid," such as highly pressurized carbon dioxide ($CO_2$) at temperatures greater than 31° C. and pressures greater than 1070 psia, may be used to remove the protective layer 220. In a related embodiment, the removal process with the supercritical material may be repeated several times to insure that all of the protective layer 220 is removed from the MEMS assembly 200 and flushed through the opening 240. In such embodiments, once the supercritical material has entered the interior of the MEMS assembly 200 and dissolved the protective layer 220, the ambient pressure surrounding the MEMS assembly 200 may be reduced, causing the supercritical fluid to be evaporated from the MEMS assembly 200, taking the dissolved protective layer 220 with it through the opening 240.

In other embodiments, other materials may be used to strip away the protective layer 220, including but not limited to a solvent, such as acetone. By using a supercritical fluid, or other fluid or material capable of stripping the protective layer 220 from the MEMS array 210, the material may penetrate not only the protective layer 220 over the mirrors 215, but also around and underneath the mirrors 215, as well as other components found on the MEMS array 210 in order to remove the protective layer 220 from all of those areas and permit the MEMS assembly 200 to function properly.

Figure 2D:
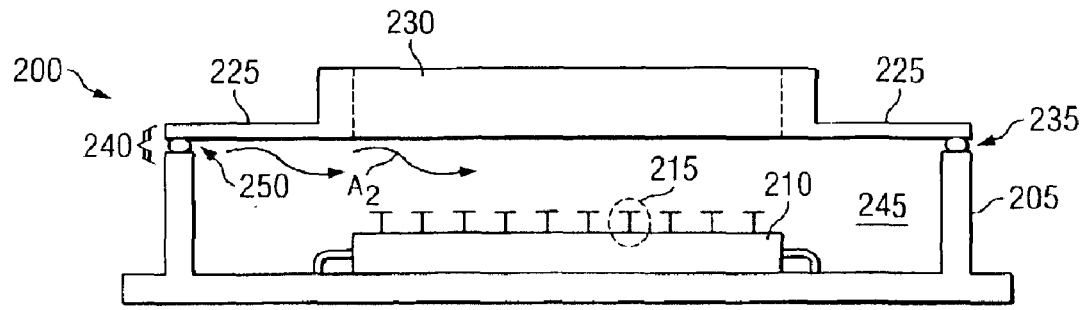
FIG. 2D illustrates the completed MEMS assembly, as constructed according to the principles of the present invention.

Turning now to FIG. 2D, illustrated is the completed MEMS assembly 200, as constructed according to the principles of the present invention. After the removing material is used to remove the protective layer 220, a passivation or lubrication step may be conducted. More specifically, many types of MEMS assemblies perform best with some type of lubrication around the parts of the MEMS array 210 so as to mitigate or prevent sticking of the mirrors to electrodes, or other similar problems that may affect device performance. In addition, the MEMS array 210 may perform well over longer periods of time if passivated to provide protection to its components. As such, the illustrated embodiment provides an opportunity to mix a lubricant or passivant into the ambient 245 of the interior of the MEMS assembly 200. For example, a passivation material, such as perflourodecanoic acid (PFDA), may be introduced into the interior to reach all the necessary places surrounding the MEMS array 210, as indicated by arrows $A_2$. Such an approach is set forth in commonly assigned co-pending patent application Ser. No. 10/454,075, and entitled "Method for Lubricating or Passivating MEMS Components", which is incorporated herein by reference.

In addition, the final ambient 245 may be selected and introduced before the opening 240 is sealed. For example, if a nitrogen-based ambient 245 is desired for the MEMS assembly 200, a nitrogen-rich gas may be introduced into the interior of the assembly 200. With this additional step, the ambient 245 of the MEMS assembly 200 may be specifically selected depending on the intended application of the assembly 200. Additionally, flushing the ambient 245 in this manner may be useful in removing any residual traces of the removal fluid used to strip the sacrificial protective layer 220. Other gases or liquids of varying viscosity or other characteristics may be introduced, as well. Moreover, a specific ambient 245 may be introduced into the interior, and then later flushed, if beneficial to particular applications. Of course, no specific ambient 245 is required to practice the present invention, or the ambient 245 may comprise any elements or compounds without deviating from the scope of the invention disclosed herein.

After removal of the protective layer 220, the opening 240 is sealed to further protect the MEMS array 210, as well as other components that may be located in the interior of the MEMS assembly 200. In one embodiment, the opening 240 may be sealed by seam-welding 250 around the entire surface where the assembly lid 225 meets the assembly substrate 205. Of course, other techniques for sealing any openings 240 between the two may also be employed to advantage. For example, epoxy or other curable fillers or adhesives may be used to form a seal or to completely enclose the assembly 200. Additionally, a plug may be used to seal the opening 240. The resulting enclosed cavity may be hermetically sealed or not.

Figure 3:
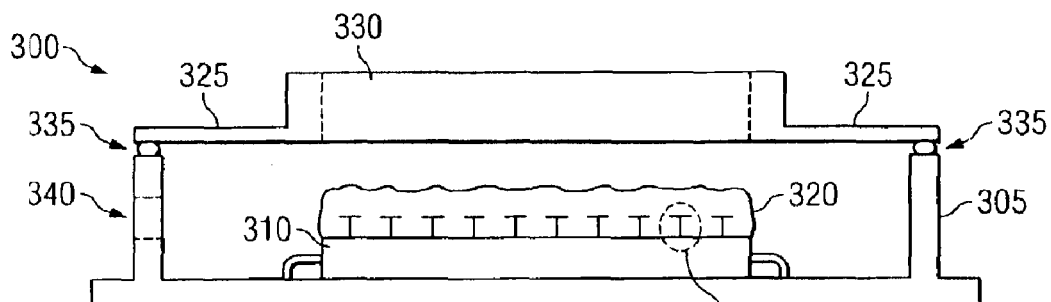
FIG. 3 illustrates a side section view of another embodiment of a MEMS assembly, constructed according to the principles of the present invention.

Looking now at FIG. 3, illustrated is a side section view of another embodiment of a MEMS assembly 300. As shown, the MEMS assembly 300 also includes an assembly substrate 305 on which a MEMS array 31 0 having a plurality of micro-mirrors 315 is mounted. Covering the MEMS array 310 is also a protective layer 320, such as photoresist or other appropriate material. Once the MEMS array 310 is mounted, an assembly lid 325, having a window 330 for incident light to pass through, is coupled to the assembly substrate 305 and over the MEMS array 310.

However, in this embodiment, the assembly lid 325 is completely sealed to the assembly substrate 305 prior to the removal of the protective layer 320. As before, the lid 325 may be sealed to the substrate 305 using, for example, seam-welding 335 between the two. Of course, other techniques to couple to two together may also be employed. Although the lid 325 has been sealed to the substrate 305, an opening 340 has been incorporated into the assembly substrate 305 for the purpose of stripping the protective layer 320 from the MEMS array 310 in the manner disclosed herein. Alternatively, the opening 340 may be incorporated into the lid 325. Thus, like the opening 240 illustrated in FIG. 2C, the opening 340 in FIG. 3 may be used to introduce a removing fluid or compound into the interior of the MEMS assembly 300 to dissolve, and thereby remove, the protective layer 320 from the MEMS array 310 through the opening 340, allowing it to function as intended, without the risk of contamination or other type of damage to the MEMS array 310 typically present during conventional manufacturing processes. This opening 340 could then be sealed after the removal of the protective layer 320 using one of the techniques described above, or any other available technique.

Figure 4:
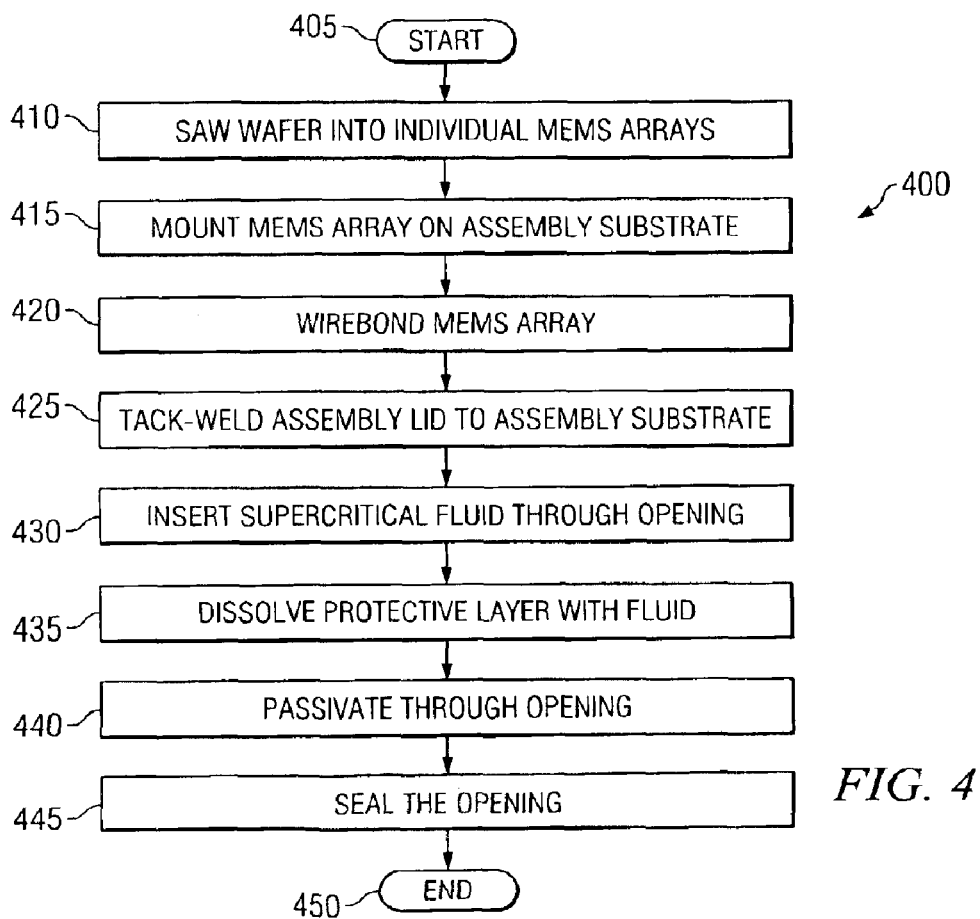
FIG. 4 illustrates a flow diagram of one embodiment of a method for manufacturing MEMS assemblies employing the techniques of the present invention.

Turning finally to FIG. 4, illustrated is a flow diagram 400 of one embodiment of a method for manufacturing MEMS assemblies, such as the assemblies described above, employing the techniques disclosed herein. The method begins at a start block 405 where any initial manufacturing steps not directly associated with the principles disclosed herein are performed on the MEMS assembly. For example, the steps employed to manufacture the MEMS array on a semiconductor wafer may be performed in this initial stage of manufacturing.

At block 410, a semiconductor wafer on which multiple MEMS arrays have been formed is sawed into individual arrays. Prior to sawing, the entire wafer is covered with a protective layer, such as the photoresist described above, to protect the MEMS arrays from contaminants, as well as physical, damage during other stages of manufacturing. Known singulation techniques may be used to saw the wafer into the individual arrays.

As the process moves to block 415, an individual MEMS array, cut from the wafer, is mounted onto an assembly substrate. In particular, traces and contact pads associated with the MEMS array are aligned with associated traces and contact pads formed on the assembly substrate. At block 420, wire-bonding is employed to electrically couple those contacts of the MEMS array to the contacts of the assembly substrate. Employable wire-bonding techniques are widely known, and any such technique may be employed with the present process.

Moving on to block 425, the assembly lid is tack-welded to the assembly substrate, to partially couple the two together and create an interior of the MEMS assembly in which the MEMS array is located. By only partially coupling the two together, openings between individual tack-welds remain, through which removal fluids may be forced or otherwise introduced into the interior of the MEMS assembly. At block 430, a supercritical material is introduced into the interior of the MEMS assembly. The supercritical material is used to dissolve the protective layer, as indicated in block 435, and to remove the protective layer from over and around the MEMS array through the opening (s). As discussed above, the lid and substrate may be completely welded together at block 425 of the process, causing a hermetic, or other appropriate, seal between the two. In such an embodiment, an opening(s), other than one associated with tack-welds between the lid and substrate, is engineered into the substrate or lid. This opening may then be used to introduce supercritical fluid or other material into the interior of the MEMS assembly, at block 430, to strip the protective layer from the MEMS array.

Also as discussed above, in another embodiment, the removal fluid need not be a supercritical fluid, but may instead be a solvent or any type of removal fluid capable of removing the protective layer through the opening(s) without excessive damage to the MEMS array. In such embodiments, the solvent not only removes the protective layer, but may also help clean various surfaces within the interior of the MEMS assembly. In yet another embodiment, a supercritical fluid may first be used to dissolve and remove the protective layer, and then a solvent may be employed to clean-up surfaces after the removal. In a related embodiment, the MEMS assembly may be baked after using the solvent in order to help release structures within the MEMS array held by capillary stiction, which often cause certain components of the MEMS array to stick together as a result of the drying stage of the cleaning process. In yet another embodiment, a solvent may first be employed to remove the protective layer, and then a supercritical fluid may be employed to clean-up residual solvent or particles of the protective layer, and to help release structures held by capillary stiction. Moreover, in any or all of such exemplary embodiments, the protective layer may be specifically engineered from specific elements or compounds for easy removal with certain supercritical fluids or solvents, thus further improving the manufacturing process.

Once the protective layer is stripped from on and around the MEMS array, the process moves to block 440 where the option to passivate and/or lubricate the components within the MEMS assembly, primarily the MEMS array, is presented. If desired, a passivant or lubricant may be introduced through the opening(s) in the MEMS assembly and permitted to infiltrate all areas of its interior. In addition, in embodiments where a getter is formed in the interior of the MEMS assembly, the opening may be employed in this manner to activate the getter to provide lubrication or passivation to the components within the MEMS assembly over the life of the assembly. However, such coating through the opening(s), or at any stage of the manufacturing process, may be employed or not employed in the methods disclosed in this application. For a more detailed discussion on getter formation in MEMS assemblies, see U.S. Pat. No. 5,610,438, entitled "Micro-Mechanical Device with Non-Evaporable Getter", commonly assigned with the present application, and incorporated herein by reference.

At block 445, the opening(s) in the MEMS assembly is filled or otherwise sealed. By sealing the opening(s), the interior of the MEMS assembly is protected from external contaminants. In addition, by sealing the opening(s), the ambient of the interior of the MEMS assembly may be maintained if desired, depending on the particular application. Once the opening(s) is sealed, the process ends at block 450, and the MEMS assembly may then be mounted to a larger DMD device, or otherwise put into operation for its intended application.

By employing any process following the principles disclosed herein, such as those described above with reference to the MEMS assemblies 200, 300 and the exemplary process in FIG. 4, MEMS assemblies, and manufacturing processes for the MEMS assemblies, having significant advantages over those found in the prior art, and produced using conventional techniques, may be manufactured. Specifically, by allowing the protective layer to remain on and around the MEMS array until after the MEMS assembly is coupled together, the MEMS array therein is not left exposed during various early stages of manufacture of the assembly. For example, the protective layer may remain over the MEMS array before, during, and after the removal of the sacrificial layer. Among conventional techniques, the MEMS array is exposed at this stage of the process to potential contamination from the handling, processing, and staging environments. In addition, the process described may provide protection from contamination during the wire-bonding stage of manufacture. In such an embodiment, it may be necessary to remove portions of the protective layer covering the bonding pads prior to enclosing the MEMS array. Once these portions are removed, the bond pads on the MEMS array are exposed and may be wire-bonded to bond pads located on the MEMS substrate. In this embodiment, the remaining portions of the protective layer provide substantial protection from debris potentially generated during the wire-bonding process to critical components of the MEMS array. Moreover, since the protective layer is still present at mounting, there is no need to expose the MEMS array in order to passivate early in the manufacturing process. Furthermore, debris or contaminants from the tack-welding process cannot reach the MEMS array, since the protective layer remains in place during the assembly of the MEMS assembly.

Thus, by reducing the overall exposure time of the MEMS array, as well as other components typically protected by the protective layer, during most of the manufacturing process, the overall risk of contaminants affecting the performance of the MEMS array, or even the chance of human contact with the MEMS array, is reduced or even eliminated. Reducing array contamination results in higher wafer yield, thus reducing overall manufacturing costs by producing a greater number of functional MEMS assemblies per wafer. In addition, in many cases, the disclosed processes involve fewer steps than conventional processes, yet yielding better results. Moreover, the disclosed processes may be incorporated into existing manufacturing processes since mostly standard materials and associated processing steps are employed. Furthermore, such incorporation is possible into almost any type of process, while still maintaining benefits such as those described above.

While various embodiments of an MEMS assembly constructed according to the principles disclosed herein, have been described above, it should be understood that they have been presented by way of example only, and not limitation. Thus, the breadth and scope of the invention(s) should not be limited by any of the above-described exemplary embodiments, but should be defined only in accordance with the following claims and their equivalents. Moreover, the above advantages and features are effected in described embodiments, but shall not limit the application of the claims to processes and structures accomplishing any or all of the above advantages. It should also be noted that the disclosed principles are not limited merely to the manufacture of a MEMS assembly for use in SLMs and the like. In fact, the disclosed processes, and variations, may be employed in the manufacture of non-mirror based MEMS devices, which may lack windows in the assembly lid discussed above. Moreover, any device having delicate moveable components may benefit from use of the principles disclosed herein.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field of the Invention," the claims should not be limited by the language chosen under this heading to describe the so-called field of the invention. Further, a description of a technology in the "Background of the Invention" is not to be construed as an admission that technology is prior art to any invention(s) in this disclosure. Neither is the "Brief Summary of the Invention" to be considered as a characterization of the invention(s) set forth in the claims set forth herein. Furthermore, the reference in these headings, or elsewhere in this disclosure, to "invention" in the singular should not be used to argue that there is only a single point of novelty claimed in this disclosure. Multiple inventions may be set forth according to the limitations of the multiple claims associated with this disclosure, and the claims accordingly define the invention(s) that are protected thereby. In all instances, the scope of the claims shall be considered on their own merits in light of the specification, but should not be constrained by the headings set forth herein.

What is claimed is:

1. A method of manufacturing a MEMS assembly, comprising:
   mounting a MEMS device on an assembly substrate, the MEMS device having a sacrificial layer;
   coupling an assembly lid to the assembly substrate and over the MEMS device to create an interior of the MEMS assembly housing the MEMS device, the coupling maintaining an opening to the interior of the MEMS assembly; and
   removing the sacrificial layer through the opening.

2. A method according to claim 1, wherein the sacrificial layer is a protective photoresist.

3. A method according to claim 1, wherein the coupling comprises tack-welding.

4. A method according to claim 3, wherein the opening comprises spaces between tack-welding beads formed during the tack-welding.

5. A method according to claim 1, wherein the opening comprises a vent in the assembly substrate.

6. A method according to claim 1, wherein the removing comprises removing the sacrificial layer using a supercritical compound introduced through the opening.

7. A method according to claim 6, wherein the supercritical compound is compressed $CO_2$.

8. A method according to claim 1, further comprising lubricating components formed on the MEMS device by introducing a lubricant through the opening.

9. A method according to claim 1, further comprising sealing the opening after removing the protective layer.

10. A method according to claim 1, wherein the mounting includes mounting a MEMS device on an assembly substrate by removing portions of the sacrificial layer covering bond pads on the MEMS device, and wire-bonding to the exposed bond pads and to bond pads on the assembly substrate.

* * * * *